United States Patent
Kim et al.

(10) Patent No.: US 8,405,173 B2
(45) Date of Patent: Mar. 26, 2013

(54) MAGNETIC MEMORY DEVICES

(75) Inventors: Woojin Kim, Yongin-si (KR); Sechung Oh, Suwon-si (KR); Jangeun Lee, Suwon-si (KR); Jeahyoung Lee, Seoul (KR); Junho Jeong, Suwon-si (KR); Woo Chang Lim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 102 days.

(21) Appl. No.: 13/159,236

(22) Filed: Jun. 13, 2011

(65) Prior Publication Data

US 2011/0303996 A1  Dec. 15, 2011

(30) Foreign Application Priority Data

Jun. 15, 2010  (KR) .................. 10-2010-0056651

(51) Int. Cl.
*H01L 29/82* (2006.01)
(52) U.S. Cl. ............................... 257/421; 257/E29.323
(58) Field of Classification Search .................. 257/421, 257/E29.323
See application file for complete search history.

(56) References Cited

U.S. PATENT DOCUMENTS

| | | | |
|---|---|---|---|
| 5,695,864 A | 12/1997 | Slonczewski | |
| 6,532,164 B2 * | 3/2003 | Redon et al. ................. 365/97 |
| 6,992,359 B2 | 1/2006 | Nguyen et al. | |
| 7,948,044 B2 * | 5/2011 | Horng et al. ................. 257/421 |
| 7,957,181 B2 * | 6/2011 | Nozieres et al. ............. 365/171 |
| 8,208,295 B2 * | 6/2012 | Dieny ........................... 365/171 |
| 2012/0261777 A1 * | 10/2012 | Shukh ........................... 257/421 |

FOREIGN PATENT DOCUMENTS

| | | |
|---|---|---|
| JP | 2008-028362 | 2/2008 |
| KR | 1020060009337 A | 1/2006 |
| KR | 1020060125913 A | 12/2006 |

OTHER PUBLICATIONS

J.C. Slonczewski; "Current-Driven Excitation of Magnetic Multilayers" Journal of Magnetism and Magnetic Materials 159, (1996) pp. L1-L7.
L. Berger; Emission of Spin Waves by a Magnetic Multilayer Traversed by a Current Physical Review B, vol. 54, No. 13, Oct. 1, 1996, pp. 9353-9358.
E.B. Myers et al.; "Current-Induced Switching of Domains in Magnetic Multilayer Devices" Science 285, 896 (1999) pp. 1-13.

* cited by examiner

*Primary Examiner* — Trung Q Dang
(74) *Attorney, Agent, or Firm* — Myers Bigel Sibley & Sajovec, P.A.

(57) ABSTRACT

A magnetic memory device includes a reference magnetic layer having a fixed magnetization direction, a tunnel barrier layer on the reference magnetic layer, a free layer having a variable magnetization direction on the tunnel barrier layer opposite the reference magnetic layer, and a magnetization reversal auxiliary layer on the free layer. The magnetization reversal auxiliary layer has a fixed magnetization direction that is substantially perpendicular to a plane along an interface between the tunnel barrier layer and the reference layer. The magnetization reversal auxiliary layer may be directly on the free layer, or an exchange coupling control layer may be provided between the magnetization reversal auxiliary layer and the free layer.

20 Claims, 5 Drawing Sheets

MAGNETIC MEMORY DEVICES

CROSS-REFERENCE TO RELATED APPLICATIONS

This U.S. non-provisional patent application claims priority under 35 U.S.C. §119 from Korean Patent Application No. 10-2010-0056651, filed on Jun. 15, 2010, the disclosure of which is hereby incorporated by reference herein in its entirety.

BACKGROUND

The present inventive concept herein relates to memory devices, and more particularly, to magnetic memory devices.

As electronic devices are expected to operate at higher speeds and lower power consumption, memory devices included in the electronic devices may also be needed to provide faster read/write operation and lower operational voltage. In order to satisfy these requirements, magnetic memory devices are being studied. Since a magnetic memory device may offer high speed operation and/or nonvolatile characteristics, it is a good candidate for next-generation memory.

A magnetic memory device may have a magnetic tunnel junction (MTJ). The magnetic tunnel junction (MTJ) is formed by two magnetic substances and an insulating layer disposed between the two magnetic substances. A resistance of the magnetic tunnel junction (MTJ) may be altered according to the respective magnetization directions of the two magnetic substances. More specifically, when magnetization directions of the two magnetic substances are anti-parallel to each other (e.g. in opposite directions relative to one another), the magnetic tunnel junction (MTJ) has a relatively large or higher resistance, and when magnetization directions of the two magnetic substances are parallel to each other (e.g. in the same direction relative to one another), the magnetic tunnel junction (MTJ) has a relatively small or lower resistance. Data may be written/read based on the difference of resistance. A current density for reversing the magnetization of a free layer of a magnetic memory device is called a critical current density (Jc).

SUMMARY

Embodiments of the inventive concept provide a magnetic memory device. The magnetic memory device may include a tunnel barrier layer between a first electrode and a second electrode; a reference magnetic layer between the first electrode and the tunnel barrier layer; a first magnetization reversal auxiliary layer between the second electrode and the tunnel barrier layer; and a horizontal free layer between the tunnel barrier layer and the first magnetization reversal auxiliary layer. A magnetization direction of the first magnetization reversal auxiliary layer is substantially fixed to a direction substantially perpendicular to a top plane of the tunnel barrier layer.

According to some embodiments of the inventive concept, a nonvolatile memory device includes a reference magnetic layer having a fixed magnetization direction; a tunnel barrier layer on the reference magnetic layer; a free layer on the tunnel barrier layer opposite the reference magnetic layer, the free layer having a variable magnetization direction; and a magnetization reversal auxiliary layer directly on the free layer. The magnetization reversal auxiliary layer has a fixed magnetization direction that is substantially perpendicular to a plane along an interface between the tunnel barrier layer and the reference layer.

In some embodiments, the auxiliary layer reduces a critical current density required to rotate the variable magnetization direction of the free layer.

In some embodiments, a total magnetic moment of the magnetization reversal auxiliary layer is less than or equal to a total magnetic moment of the free layer.

In some embodiments, the free layer may have substantially no vertical magnetic component in the absence of a voltage applied thereto.

In some embodiments, the magnetization direction of the auxiliary layer is substantially fixed independent of a voltage, current, and/or magnetic field applied thereto. For example, the magnetization direction of the auxiliary layer may remain substantially fixed responsive to an external magnetic field of about 1000 gauss applied thereto and/or responsive to a voltage of about 1.2 to about 1.8V applied thereto.

In some embodiments, the fixed magnetization direction of the reference magnetic layer is substantially parallel to the plane along the interface between the tunnel barrier layer and the reference layer.

In some embodiments, the magnetization reversal auxiliary layer comprises a material having a face centered cubic lattice structure and a crystalline growth face in a {111} plane, and the magnetization reversal auxiliary layer has a thickness of about 10 Angstroms (Å) to about 50 Å. For example, the magnetization reversal auxiliary layer may include alternating first and second layers, wherein the first layers comprise cobalt (Co), cobalt iron (CoFe), and/or cobalt chromium (CoCr), and wherein the second layers comprise palladium (Pd), platinum (Pt), nickel (Ni) and/or ruthenium (Ru).

In some embodiments, the magnetization reversal auxiliary layer comprises an amorphous layer, and the magnetization reversal auxiliary layer has a thickness of about 5 Angstroms (Å) to about 60 Å. For example, the magnetization reversal auxiliary layer may include cobalt iron terbium (CoFeTb), cobalt iron dysprosium (CoFeDy), and/or cobalt iron gadolinium (CoFeGd).

In some embodiments, the magnetization reversal auxiliary layer comprises a $L1_0$ structure, and the magnetization reversal auxiliary layer has a thickness of about 5 Angstroms (Å) to about 30 Å. For example, the magnetization reversal auxiliary layer may include iron platinum (FePt), iron palladium (FePd), iron nickel (FeNi), cobalt platinum (CoPt), cobalt palladium (CoPd), or cobalt nickel (CoNi).

In some embodiments, the magnetization reversal auxiliary layer comprises a hexagonal close packed structure having a thickness of about 5 Angstroms (Å) to about 30 Å. For example, the magnetization reversal auxiliary layer may include cobalt platinum (CoPt), cobalt palladium (CoPd), cobalt manganese (CoMn), cobalt chromium platinum (CoCrPt), cobalt chromium palladium (CoCrPd), or cobalt chromium manganese (CoCrMn). A major axis of the hexagonal close packed structure may be substantially perpendicular to the plane along the interface between the tunnel barrier layer and the reference layer.

In some embodiments, the magnetization reversal auxiliary layer may include alternating first and second layers, wherein the first layers comprise iron (Fe), cobalt (Co), and/or nickel (Ni), wherein the second layers comprise chromium (Cr), platinum (Pt), palladium (Pd), iridium (Ir), ruthenium (Ru), rhodium (Rh), osmium (Os), rhenium (Re), gold (Au), and/or copper (Cu).

In some embodiments, a seed layer is provided on the magnetization reversal auxiliary layer opposite the free layer. The seed layer comprises a material from which the auxiliary layer is formed. For example, the seed layer may include palladium (Pd), platinum (Pt), chromium-ruthenium alloy (CrRu), nickel (Ni), ruthenium (Ru), titanium (Ti) and/or titanium nitride (TiN), and wherein the seed layer has a thickness of less than about 10 Å.

In some embodiments, the seed layer may be palladium (Pd), platinum (Pt) and/or chromium-ruthenium (CrRu) having a crystalline growth face in a {111} plane or in a {100} plane.

In some embodiments, the magnetization reversal auxiliary layer comprises a second magnetization reversal auxiliary layer, and the device further includes a first magnetization reversal auxiliary layer directly on the free layer opposite the second magnetization reversal auxiliary layer and extending between the free layer and the tunnel barrier layer. The first magnetization reversal auxiliary layer has a fixed magnetization direction that is substantially perpendicular to the plane along the interface between the tunnel barrier layer and the reference layer.

In some embodiments, the second magnetization reversal auxiliary layer has a same fixed magnetization direction as the first magnetization reversal auxiliary layer.

In some embodiments, the fixed magnetization direction of the first magnetization reversal auxiliary layer is in a first direction that is substantially perpendicular to a top plane of the tunnel barrier layer, or is in a second direction that is anti-parallel to the first direction.

In some embodiments, a thickness of the memory device between the reference magnetic layer and the magnetization reversal auxiliary layer is about 300 Angstroms (Å) to about 400 Å.

In some embodiments, a thickness of the horizontal free layer is about 5 Angstroms (Å) to about 40 Å.

In some embodiments, the tunnel barrier layer may be a non-magnetic insulating layer having a thickness less than a spin diffusion distance.

According to further embodiments of the inventive concept, a nonvolatile memory device includes a reference magnetic layer; a tunnel barrier layer on the reference magnetic layer; a free layer on the tunnel barrier layer opposite the reference magnetic layer, the free layer having a variable magnetization direction; an exchange coupling control layer on the free layer opposite the tunnel barrier layer; and a magnetization reversal auxiliary layer on the exchange coupling control layer, the auxiliary layer having a fixed magnetization direction that is substantially perpendicular to a plane along an interface between the tunnel barrier layer and the reference layer. The exchange coupling control layer comprises a material configured to strengthen an exchange coupling between the free layer and the auxiliary layer.

In some embodiments, the exchange coupling control layer comprises a material configured to transfer a vertical magnetic component of the magnetization reversal auxiliary layer to the free layer. For example, the exchange coupling control layer may be a magnetic material having an exchange coupling constant that is sufficient to increase the exchange coupling between the free layer and the auxiliary layer, or a nonmagnetic material configured to increase surface magnetic anisotropy.

In some embodiments, the exchange coupling control layer comprises transition metal. For example, the exchange coupling control layer may include titanium (Ti), chromium (Cr), ruthenium (Ru), copper (Cu), manganese (Mn), vanadium (V), osmium (Os), platinum (Pt), palladium (Pd), rhodium (Rh), rhenium (Re), and/or gold (Au).

In some embodiments, an oxide layer may be provided between the exchange coupling control layer and the magnetization reversal auxiliary layer thereon.

In some embodiments, the exchange coupling control layer comprises a second exchange coupling control layer, the magnetization reversal auxiliary layer comprises a second magnetization reversal auxiliary layer, and the device further includes a first exchange coupling control layer on the free layer opposite the second exchange coupling control layer; and a first magnetization reversal auxiliary layer on the first exchange coupling control layer opposite the free layer. The first magnetization reversal auxiliary layer and the first exchange coupling control layer extend between the tunnel barrier layer and the free layer.

In some embodiments, the first and second exchange coupling control layers are directly on the free layer on opposite sides thereof.

In some embodiments, the first and second magnetization reversal auxiliary layers are directly on the first and second exchange coupling control layers, respectively, on opposite sides of the free layer.

In some embodiments, the exchange coupling control layer has a thickness of about 2 Å to about 20 Å.

According to still further embodiments of the inventive concept, a nonvolatile memory device includes a reference magnetic layer comprising an antiferromagnetic pinning layer and a ferromagnetic pinned layer having a fixed magnetization direction in a plane along an interface therebetween; a tunnel barrier layer comprising an oxide layer on the reference magnetic layer; a first magnetization reversal auxiliary layer on the tunnel barrier layer opposite the reference magnetic layer, the first magnetization reversal auxiliary layer having a fixed magnetization direction that is substantially perpendicular to the plane defined by the interface between the pinned and pinning layers; a first exchange coupling control layer on the first magnetization reversal auxiliary layer opposite the tunnel barrier layer; a free layer on the first exchange coupling control layer, the free layer comprising a ferromagnetic layer having a variable magnetization direction; a second exchange coupling control layer on the free layer opposite the first exchange coupling control layer, the first and second exchange coupling control layers respectively comprising materials configured to strengthen an exchange coupling between the free layer and the first and second exchange coupling control layers on opposite sides thereof; and a second magnetization reversal auxiliary layer on the second exchange coupling layer, the second magnetization reversal auxiliary layer having a fixed magnetization direction that is substantially perpendicular to the plane defined by the interface between the pinned and pinning layers.

Other devices and/or fabrication methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF EMBODIMENTS

Figure 1:
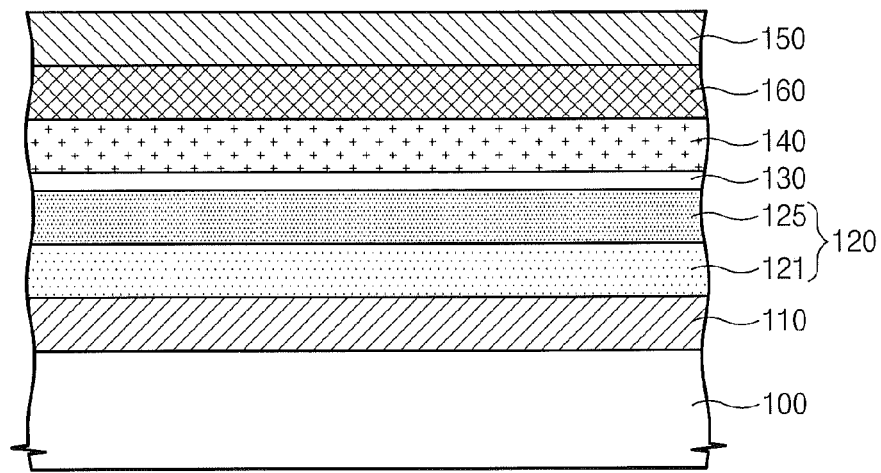
FIG. 1 is a drawing for explaining a magnetic memory device in accordance with some embodiments of the inventive concept.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that when an element or layer a layer (or film) such as a conductive layer, a semiconductor layer, and a dielectric layer is referred to as being "on," "connected to" or "coupled to" another element or layer, it can be directly on, connected or coupled to the other element or layer or intervening elements or layers may be present. In contrast, when an element is referred to as being "directly on," "directly connected to," "directly coupled to," or "in direct contact with" another element or layer, there are no intervening elements or layers present. Other expressions for describing relationships between elements, for example, "between" and "immediately between" or "neighboring" and "directly neighboring" may also be understood likewise.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. As used herein, the term "and/or" includes any and all combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the inventive concept may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

Referring to FIG. 1, a first electrode 110 may be provided onto a substrate 100. The substrate 100 may include a conductive region and/or an active region. The substrate 100 may have an arbitrary semiconductor based structure. For example, the substrate 100 may include a silicon epitaxial layer supported by a semiconductor structure such as silicon, silicon on insulator (SOI), silicon germanium (SiGe), gallium arsenic (GaAs), doped silicon or undoped silicon, etc. The first electrode 110 may be electrically connected to the active region of the substrate 100. The first electrode 110 may be formed of at least one selected from transition metal, conductive transition metal nitride and conductive ternary nitride. The first electrode 110 may be formed by a sputtering or a plasma-enhanced chemical vapor deposition (PECVD).

A reference magnetic layer 120 may be provided onto the first electrode 110. The reference magnetic layer 120 may have a magnetization direction that is substantially parallel to a top plane along a surface of the substrate 100 or other plane parallel thereto. The reference magnetic layer 120 may include a pinning layer 121 and a pinned layer 125. The pinning layer 121 may include an anti-ferromagnetic material. For example, the pinning layer 121 may include at least one selected from PtMn, IrMn, MnO, MnS, MnTe, $Mnf_2$, $FeCl_2$, FeO, $CoCl_2$, CoO, $NiCl_2$, NiO and Cr. In an embodiment, the pinning layer 121 may include rare metal. For example, the pinning layer 121 may include at least one selected from ruthenium (Ru), rhodium (Rh), palladium (Pd), osmium (Os), iridium (Ir), platinum (Pt), gold (Au) and silver (Ag). The pinned layer 125 may have a magnetization direction substantially fixed by the pinning layer 121. The pinned layer 125 may include ferromagnetic material. In an embodiment, the pinned layer 125 may include a layer including ferromagnetic material. The pinned layer 125 may include at least one selected from, for example, CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO and $Y_3Fe_5O_{12}$.

A tunnel barrier layer 130 may be provided onto the reference magnetic layer 120. The tunnel barrier layer 130 may have a thickness smaller than a spin diffusion distance. The tunnel barrier layer 130 may include nonmagnetic material. For example, the tunnel barrier layer 130 may include an oxide of magnesium (Mg), titanium (Ti), aluminum (Al), magnesium-zinc (MgZn) and magnesium-boron (MgB), and a nitride of titanium (Ti) and vanadium (V). The tunnel barrier layer 130 may have a predetermined crystalline structure. For example, the tunnel barrier layer 130 may have a body-centered cubic lattice structure. An interface between the tunnel barrier layer 130 and the reference magnetic layer 120 may define a plane that is substantially parallel to the top plane along the surface of the substrate 100.

A horizontal free layer 140 may be provided onto the tunnel barrier layer 130. The horizontal free layer 140 may include material having a changeable magnetization direction. A magnetization direction of the horizontal free layer 40 may be substantially parallel to a top plane of the substrate 100 when a magnetic memory device operates. A magnetization direction of the horizontal free layer 40 may be altered by electrical factors and/or magnetic factors which may be internal or external to the magnetic memory device. According to whether or not a magnetization direction of the horizontal free layer 140 is parallel to a magnetization direction of the reference magnetic layer 120, a magnetic resistance of a magnetic memory cell including the horizontal free layer 140 and the reference magnetic layer 120 may vary. In particular, the magnetic memory cell may have a lower resistance when the magnetization directions of the reference magnetic layer 120 and the horizontal free layer are substantially parallel, and may have a higher resistance when the magnetization directions of the reference magnetic layer 120 and the horizontal free layer are antiparallel. Using the foregoing, writing and/or readout of data of the magnetic memory device may be performed. The horizontal free layer 140 may include ferromagnetic material including at least one of cobalt (Co), ferrum/iron (Fe) and nickel (Ni). For example, the horizontal free layer 140 may include at least one selected from FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO and $Y_3Fe_5O_{12}$. A thickness of the horizontal free layer 140 may be about 5-40 angstroms (Å).

The horizontal free layer 140 may include multiple layers. For example, the horizontal free layer 140 may include a plurality of ferromagnetic material layers, and layers including nonmagnetic material disposed between the plurality of layers. In this case, the layers including the ferromagnetic material and the layer(s) including the nonmagnetic material may define a synthetic antiferromagnetic layer. The synthetic antiferromagnetic layer may reduce a critical current density of a magnetic memory device and may improve a thermal stability.

A magnetization reversal auxiliary layer 160 may be provided onto the horizontal free layer 140. A magnetization direction of the magnetization reversal auxiliary layer 160 may be substantially fixed in a direction that is substantially perpendicular to a top plane along a surface of the substrate 100. For example, the magnetization reversal auxiliary layer 160 may have a magnetization direction substantially fixed in either a first direction that is substantially perpendicular to a top plane of the substrate 100, or a second direction that is anti-parallel to the first direction. The magnetization reversal auxiliary layer 160 eases magnetization reversal of the horizontal free layer 140, thereby lowering a critical current density (Jc). A rotation of the magnetization direction is required in order for the magnetization direction of the horizontal free layer 140 (which may be in a third direction parallel to a top plane of the substrate 100) to be magnetic-reversed into a fourth direction that is anti-parallel to the third direction, thereby altering the resistance of the free layer 140. The rotation of the magnetization direction may get out of the top plane of the substrate 100 or may otherwise not be parallel to the top plane of the substrate 100. The magnetization reversal auxiliary layer 160 may facilitate the rotation of the magnetization direction by a vertical magnetic component. That is, a magnetization reversal of the horizontal free layer 140 can be done at a lower critical current. Thus, a critical current density (Jc) can be lowered without reducing a saturated magnetization or a thickness of the horizontal free layer 140.

Total magnetic moment of the magnetization reversal auxiliary layer 160 may be equal to or less than total magnetic moment of the horizontal free layer 140. The total magnetic moment is a value that is in proportion to a quantity of magnetization and a volume. Thus, the horizontal free layer 140 has no vertical magnetic component under the condition that a voltage is not applied to a magnetic memory device.

A magnetization direction of the magnetization reversal auxiliary layer 160 may be substantially fixed even in the case that a current does not flow in the magnetic memory device. Also, a magnetization direction of the magnetization reversal auxiliary layer 160 may have a substantially fixed magnetization direction regardless of a direction of current flowing through the magnetic memory device. The magnetization reversal auxiliary layer 160 may have a substantially fixed magnetization direction under an external magnetic field of about 1000 Gauss. The magnetization reversal auxiliary layer 160 may have a substantially fixed magnetization direction even when a relatively high voltage is applied to the magnetic memory device. In one example, the magnetization reversal auxiliary layer 160 may have a substantially fixed magnetization direction even when a voltage of about 1.2V to about 1.8V is applied to the magnetization reversal auxiliary layer 160.

The magnetization reversal auxiliary layer 160 may be a face centered cubic lattice structure having a crystalline growth face in the {111} plane. For example, the magnetization reversal auxiliary layer 160 may be [Co/A]n, [CoFe/A]n or [CoCr/A]n (n is a repetition accumulation number, A is palladium (Pd), platinum (Pt), nickel (Ni) or ruthenium (Ru)). The n may be $2 \leq n \leq 11$. A thickness of the magnetization reversal auxiliary layer 160 having a face centered cubic lattice structure may be about 10 Angstroms (Å) to about 50 Å. In the case that a thickness of the magnetization reversal auxiliary layer 160 having a face centered cubic lattice structure is less than about 10 Å, the magnetization reversal auxiliary layer 160 may not have a substantially fixed magnetization direction. In the case that a thickness of the magnetization reversal auxiliary layer 160 having a face centered cubic lattice structure is greater than 50 Å, a magnetization direction of the horizontal free layer 140 may have a vertical magnetic component even under the condition that a voltage is not applied to a magnetic memory device. As used herein, the expression of [A/B]n represents a structure in which layer A and layer B are alternately and repeatedly stacked n times.

In another example, the magnetization reversal auxiliary layer 160 may be amorphous CoFeB (B may be terbium (Tb), dysprosium (Dy) or gadolinium (Gd)). A thickness of the amorphous magnetization reversal auxiliary layer 160 may be about 5-60 Å. In the case that a thickness of the amorphous magnetization reversal auxiliary layer 160 is out of the range of about 5-60 Å, a similar phenomenon as that described in the magnetization reversal auxiliary layer 160 having a face centered cubic lattice structure may occur. In still another example, the magnetization reversal auxiliary layer 160 may be FeC having $L1_0$ structure or CoC (where C is platinum (Pt), palladium (Pd) or nickel (Ni)). $L1_0$ is a crystallographic derivative structure of the FCC structure having alternately stacked layers with different atoms. A thickness of the magnetization reversal auxiliary layer 160 having $L1_0$ structure may be about 5-30 Å. In still another example, the magnetization reversal auxiliary layer 160 may include CoCrD having a hexagonal close packed structure or CoD (where D may be platinum (Pt), palladium (Pd) or manganese (Mn)). In one example, the magnetization reversal auxiliary layer 160 may include cobalt-platinum alloy having a hexagonal close packed structure of disordered alloy or $Co_3Pt$ having a hexagonal close packed structure of ordered alloy. A thickness of the magnetization reversal auxiliary layer 160 having a hexagonal close packed structure may be about 5-30 Å. A crystal of the magnetization reversal auxiliary layer 160 having a hexagonal close packed structure may have a major axis and a minor axis, and the major axis may be substantially perpendicular to a top plane of the substrate 100.

In another example, the magnetization reversal auxiliary layer 160 may be a structure that a magnetic layer including at least one of ferrum (Fe), cobalt (Co) and nickel (Ni) and a layer including at least one of chromium (Cr), platinum (Pt), palladium (Pd), iridium (Ir), ruthenium (Ru), rhodium (Rh), osmium (Os), rhenium (Re), gold (Au) and copper (Cu) are alternately stacked. The magnetization reversal auxiliary layer 160 may further include at least one of boron (B), copper (Cu), gold (Au), zinc (Zn), silver (Ag) and aluminum (Al).

A second electrode 150 may be provided onto the magnetization reversal auxiliary layer 160. The second electrode 150 may be the same material as the first electrode 110. The second electrode 150 may be a bit line or may be a conductor that is electrically connected to a bit line. When the magnetic memory device operates, a current may flow in a direction crossing to a top plane of the substrate 100. A thickness from a bottom surface of the reference magnetic layer 120 to a top surface of the magnetization reversal auxiliary layer 160 may be about 300-400 Å. The reference magnetic layer 120, the tunnel barrier layer 130, the horizontal free layer 140 and the magnetization reversal auxiliary layer 160 may constitute a magnetic memory cell. The magnetic memory cell may be electrically connected to a select device (not illustration) provided onto the substrate 100.

Figure 2:
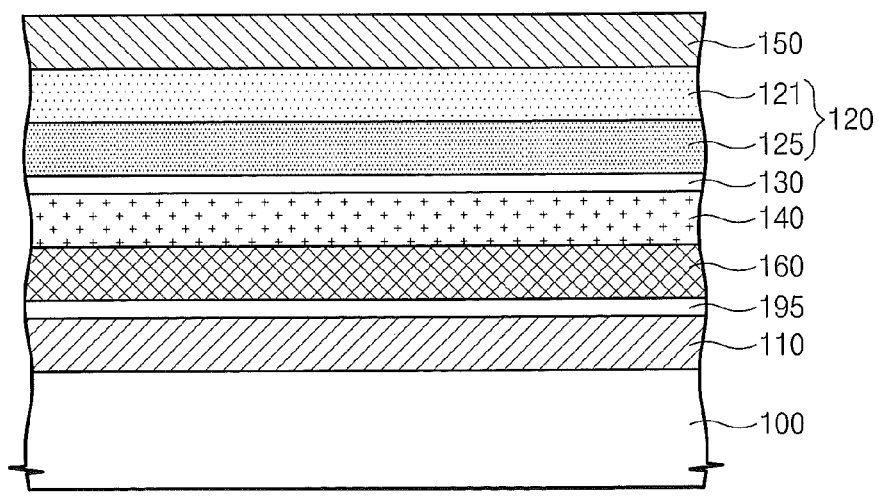
FIG. 2 is a drawing for explaining a modified example of a magnetic memory device in accordance with some embodiments of the inventive concept.

Referring to FIG. 2, a modified embodiment of the first embodiment is described. In the modified embodiment, stacking sequence of some layers may be changed from the first embodiment. That is, layers may be stacked on the first electrode 110 in the order of the magnetization reversal auxiliary layer 160, the horizontal free layer 140, the tunnel barrier layer 130 and the reference magnetic layer 120. Before forming the magnetization reversal auxiliary layer 160, a seed layer 195 may be provided onto the first electrode 110. The seed layer 195 may facilitate a formation of the magnetization reversal auxiliary layer 160 on the first electrode 110. The seed layer 195 may include at least one of palladium (Pd), platinum (Pt), chromium-ruthenium alloy (CrRu), nickel (Ni), ruthenium (Ru), titanium (Ti) and titanium nitride (TiN). Palladium (Pd), platinum (Pt) and chromium-ruthenium alloy (CrRu) may have a crystalline growth face {111} or a crystalline growth face {100}. The seed layer 195 may be formed to be smaller than 10 Å.

According to the first embodiment of the inventive concept, a critical current density may be lowered without reducing a saturated magnetization or a thickness of the free layer. Therefore, a critical current density may be lowered while maintaining a thermal stability of a magnetic memory device.

Figure 3:
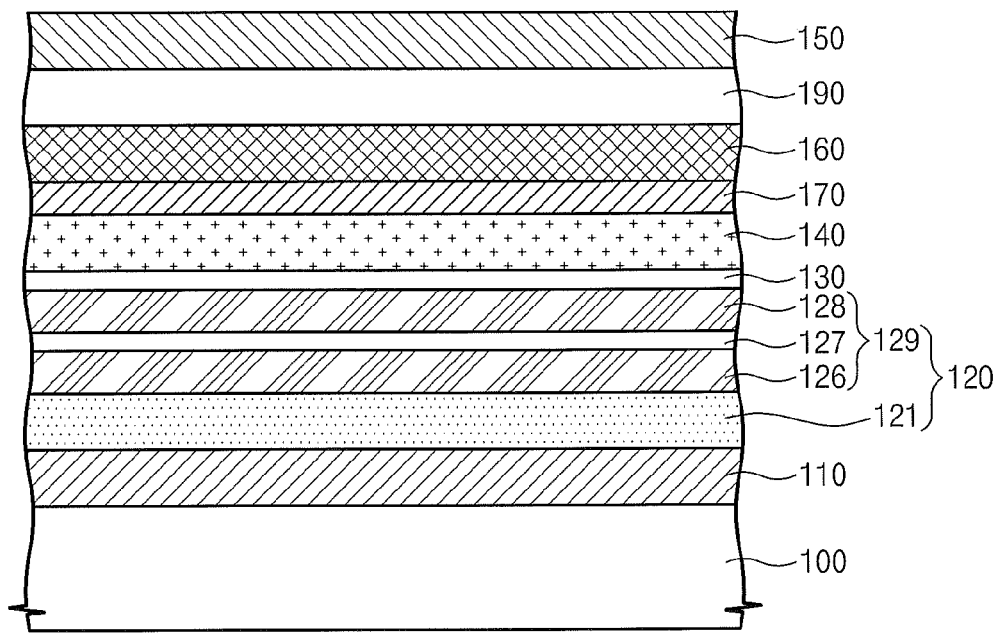
FIG. 3 is a drawing for explaining a magnetic memory device in accordance with further embodiments of the inventive concept.

Referring to FIG. 3, a magnetic memory device in accordance with a second embodiment of the inventive concept will be described. For brevity of description, the description of common features will be omitted. Referring to FIG. 3, a first electrode 110 may be provided onto a substrate 100. A reference magnetic layer 120 may be provided onto the first electrode 110. The reference magnetic layer 120 may have a magnetization direction that is substantially parallel to a top plane of the substrate 100. The reference magnetic layer 120 may include a pinning layer 121 and a pinned layer 129. The pinning layer 121 may include anti-ferromagnetic material. The pinned layer 129 may have a magnetization direction substantially fixed by the pinning layer 121. The pinned layer 129 may include ferromagnetic material. In one example, the pinned layer 129 may include a first ferromagnetic layer 126, a second ferromagnetic layer 128 and a nonmagnetic layer 127 provided between the first and second ferromagnetic layers 126 and 128. The magnetization direction of the first ferromagnetic layer 126 may be substantially fixed by the pinning layer 121. A magnetization direction of the second ferromagnetic layer 128 may be substantially fixed to be anti-parallel to the magnetization direction of the first ferromagnetic layer 126. The nonmagnetic layer 127 may fix the first and second ferromagnetic layers 126 and 128 so that they are anti-parallel to each other.

The first and second ferromagnetic layers 126 and 128 may include ferromagnetic material. For example, the first and second ferromagnetic layers 126 and 128 may include at least one selected from, for example, CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO and $Y_3Fe_5O_{12}$. The nonmagnetic layer 127 may include rare metal. For example, the nonmagnetic layer 127 may include at least one selected from ruthenium (Ru), iridium (Ir) and rhodium (Rh). A tunnel barrier layer 130 and a horizontal free layer 140 may sequentially provided onto the reference magnetic layer 120.

An exchange coupling control layer 170 may be provided onto the horizontal free layer 140. The exchange coupling control layer 170 may include magnetic material having a great exchange coupling constant or nonmagnetic material that can increase a surface magnetic anisotropy. The exchange coupling control layer 170 may include transition metal. In one example, the exchange coupling control layer 170 may be a single layer or a multi layer including at least one selected from nonmagnetic metals including at least one of titanium (Ti), chromium (Cr), ruthenium (Ru), copper (Cu), manganese (Mn), vanadium (V), osmium (Os), platinum (Pt), palladium (Pd), rhodium (Rh), rhenium (Re) and gold (Au). A thickness of the exchange coupling control layer 170 may be about 2-20 Å. The exchange coupling control layer 170 may strengthen an exchange coupling between the horizontal free layer 140 and a magnetization reversal auxiliary layer 160 that will be described later. A vertical magnetic component of the magnetization reversal auxiliary layer 160 may be easily transferred to the horizontal free layer 140 by the exchange coupling control layer 170. The exchange coupling control layer 170 may further comprise an oxide layer (not shown) on a top surface thereof. The oxide layer may be an oxide of material constituting a surface of the exchange coupling control layer 170. A formation of the oxide layer may be performed by injecting a very small amount of oxygen into a chamber where a result in which the exchange coupling control layer 170 is formed is loaded.

The magnetization reversal auxiliary layer 160 may be provided onto the exchange coupling control layer 170. The magnetization reversal auxiliary layer 160 may have a magnetization direction substantially fixed into either a first direction substantially perpendicular to a top plane of the substrate 100 or a second direction anti-parallel to the first direction. The magnetization reversal auxiliary layer 160 may facilitate a magnetization reversal of the horizontal free layer 140, thereby lowering a critical current density (Jc).

A capping layer 190 may be provided onto the magnetization reversal auxiliary layer 160. The capping layer 190 may include at least one selected from tantalum (Ta), aluminum (Al), copper (Cu), gold (Au), silver (Ag), titanium (Ti), tantalum nitride (TaN) and titanium nitride (TiN). A second electrode 150 may be provided onto the capping layer 190. The second electrode 150 may be the same material as the first electrode 110. The second electrode 150 may be a bit line or may be a conductor that is electrically connected to a bit line. Thus, according to the second embodiment of the inventive concept, a critical current density can be lowered without reducing a saturated magnetization or a thickness of the horizontal free layer 140.

Figure 4:
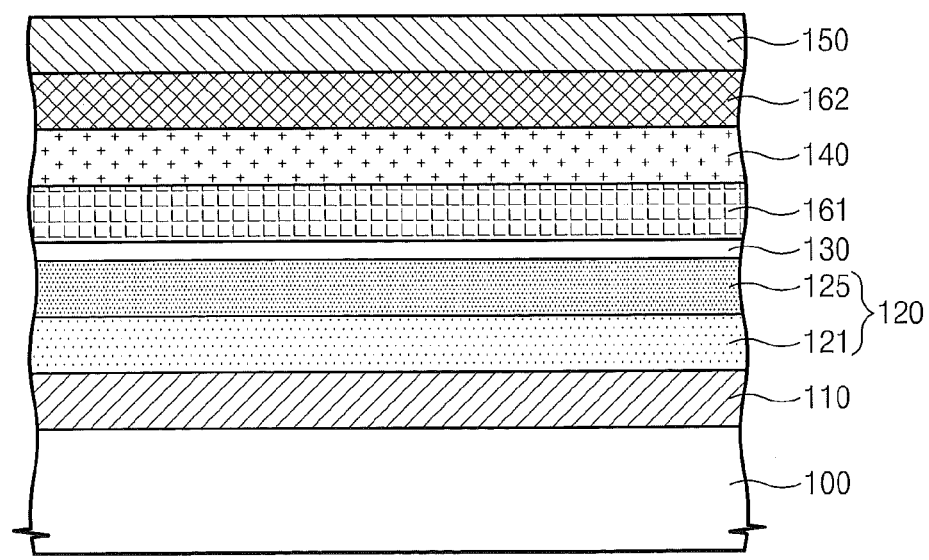
FIG. 4 is a drawing for explaining a magnetic memory device in accordance with still further embodiments of the inventive concept.

Referring to FIG. 4, a magnetic memory device in accordance with a third embodiment of the inventive concept is described. For brevity of description, the description of common features will be omitted. As shown in FIG. 4, a first electrode 110 may be provided onto a substrate 100. A reference magnetic layer 120 may be provided onto the first electrode 110. The reference magnetic layer 120 may have a magnetization direction substantially parallel to a top plane of the substrate 100. The reference magnetic layer 120 may include a pinning layer 121 and a pinned layer 125. A tunnel barrier layer 130 may be provided onto the reference magnetic layer 120.

A first magnetization reversal auxiliary layer 161 may be provided onto the tunnel barrier layer 130. The first magnetization reversal auxiliary layer 161 may have a magnetization direction substantially fixed into either a first direction substantially perpendicular to a top plane of the substrate 100 or a second direction anti-parallel to the first direction. The first magnetization reversal auxiliary layer 161 may facilitate a magnetization reversal of the horizontal free layer 140 that will be described later, thereby lowering a critical current density (Jc). The first magnetization reversal auxiliary layer 161 may be a face centered cubic lattice structure having a crystalline growth face {111}. In one example, the first magnetization reversal auxiliary layer 161 may be [Co/A]n, [CoFe/A]n or [CoCr/A]n (where n is a repetition accumulation number, A is palladium (Pd), platinum (Pt), nickel (Ni) or ruthenium (Ru)). The n may be $2 \leq n \leq 11$. In another example, the first magnetization reversal auxiliary layer 161 may be amorphous CoFeB (where B may be terbium (Tb), dysprosium (Dy) or gadolinium (Gd)). In still another example, the first magnetization reversal auxiliary layer 161 may be a $L1_0$ structure of FeC or CoC (where C is platinum (Pt), palladium (Pt) or nickel (Ni)). In still another example, the first magnetization reversal auxiliary layer 161 may include CoCrD or CoD (where D may be platinum (Pt), palladium (Pd) or manganese (Mn)) having a hexagonal close packed structure. In one example, the first magnetization reversal auxiliary layer 161 may be cobalt-platinum alloy having a hexagonal close packed structure of disordered alloy or $Co_3Pt$ having a hexagonal close packed structure of ordered alloy. In another example, the first magnetization reversal auxiliary layer 161 may be a structure that a magnetic layer including at least one of ferrum (Fe), cobalt (Co) and nickel (Ni) and a layer including at least one of chromium (Cr), platinum (Pt), palladium (Pd), iridium (Ir), ruthenium (Ru), rhodium (Rh), osmium (Os), rhenium (Re), gold (Au) and copper (Cu) are alternately stacked. The first magnetization reversal auxiliary layer 161 may further include at least one of boron (B), copper (Cu), gold (Au), zinc (Zn), silver (Ag) and aluminum (Al). A thickness of the first magnetization reversal auxiliary layer 161 may be about 5-60 Å.

A horizontal free layer 140 may be provided onto the first magnetization reversal auxiliary layer 161. The horizontal free layer 140 may include material having a changeable magnetization direction. A magnetization direction of the horizontal free layer 140 may be substantially parallel to a top plane of the substrate when the magnetic memory device operates.

A second magnetization reversal auxiliary layer 162 may be provided onto the horizontal free layer 140. The second magnetization reversal auxiliary layer 162 may have a magnetization direction substantially fixed into either a first direction substantially perpendicular to a top plane of the substrate 100 or a second direction anti-parallel to the first direction. In one example, the second magnetization reversal auxiliary layer 162 may have the same substantially fixed magnetization direction as the first magnetization reversal auxiliary layer 161. The second magnetization reversal auxiliary layer 162 makes a magnetization reversal of the horizontal free layer 140 easier, thereby lowering a critical current density (Jc). The second magnetization reversal auxiliary layer 162 may be material selected from the materials that were mentioned when describing the first magnetization reversal auxiliary layer 161. In one example, the first magnetization reversal auxiliary layer 161 and the second magnetization reversal auxiliary layer 162 may be a same material. A second electrode 150 may be provided onto the second magnetization reversal auxiliary layer 162.

Figure 5:
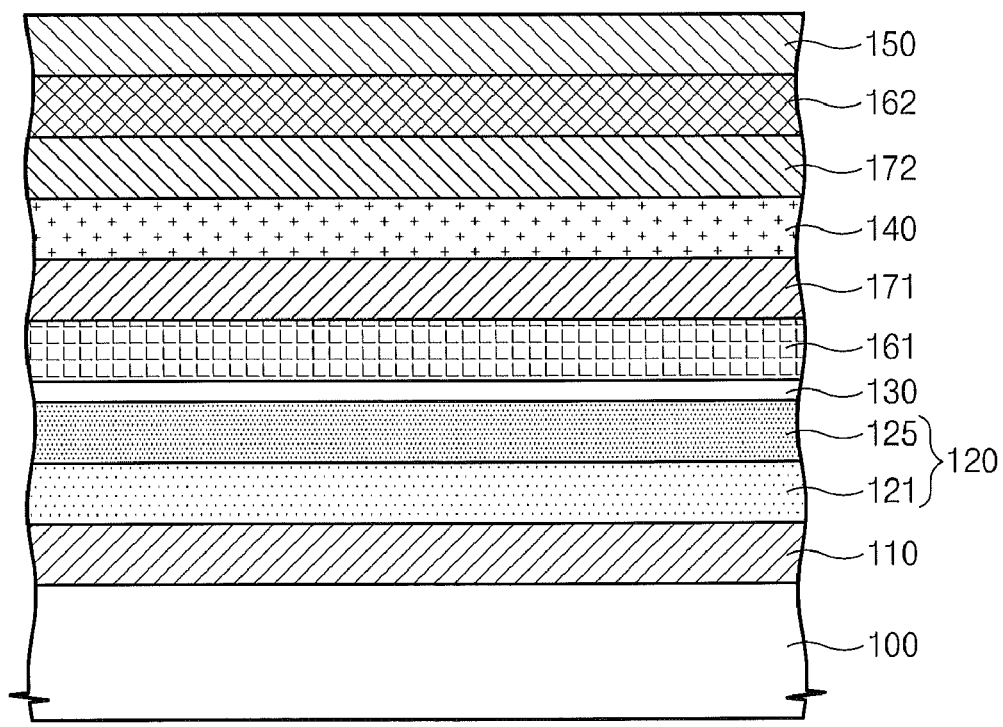
FIG. 5 is a drawing for explaining a magnetic memory device in accordance with yet further embodiments of the inventive concept.

Referring to FIG. 5, a magnetic memory device in accordance with a fourth embodiment of the inventive concept is described. For brevity of description, the description of common features is omitted. Referring to FIG. 5, a first electrode 110 may be provided onto a substrate 100. A reference magnetic layer 120 may be provided onto the first electrode 110. The reference magnetic layer 120 may have a magnetization direction substantially parallel to a top plane of the substrate 100. The reference magnetic layer 120 may include a pinning layer 121 and a pinned layer 125. A tunnel barrier layer 130 may be provided onto the reference magnetic layer 120.

A first magnetization reversal auxiliary layer 161 may be provided onto the tunnel barrier layer 130. The first magnetization reversal auxiliary layer 161 may have a magnetization direction substantially fixed into either a first direction substantially perpendicular to a top plane of the substrate 100 or a second direction anti-parallel to the first direction. The first magnetization reversal auxiliary layer 161 may facilitate a magnetization reversal of the horizontal free layer 140 that will be described later, thereby lowering a critical current density (Jc). A horizontal free layer 140 may be provided onto the first magnetization reversal auxiliary layer 161. The horizontal free layer 140 may include material having a changeable magnetization direction. A magnetization direction of the horizontal free layer 140 may be substantially parallel to a top plane of the substrate when the magnetic memory device operates.

A first exchange coupling control layer 171 may be provided between the first magnetization reversal auxiliary layer 161 and the horizontal free layer 140. The first exchange coupling control layer 171 may include magnetic material having a great exchange coupling constant or nonmagnetic material that can increase a surface magnetic anisotropy. The first exchange coupling control layer 171 may include transition metal. In one example, the first exchange coupling control layer 171 may include at least one selected from nonmagnetic metals including at least one of titanium (Ti), chromium (Cr), ruthenium (Ru), copper (Cu), manganese (Mn), vanadium (V), osmium (Os), platinum (Pt), palladium (Pd), rhodium (Rh), rhenium (Re) and gold (Au). A thickness of the first exchange coupling control layer 171 may be about 2-20 Å. The first exchange coupling control layer 171 may strengthen an exchange coupling between the horizontal free layer 140 and the first magnetization reversal auxiliary layer 161. The first exchange coupling control layer 171 may increase a vertical magnetic anisotropy of surfaces of magnetic layers adjacent to the first exchange coupling control layer 171.

A second magnetization reversal auxiliary layer 162 may be provided onto the horizontal free layer 140. The second magnetization reversal auxiliary layer 162 may have a magnetization direction substantially fixed into either a first direction substantially perpendicular to a top plane of the substrate 100 or a second direction anti-parallel to the first direction. The second magnetization reversal auxiliary layer 162 makes a magnetization reversal of the horizontal free layer 140 easier, thereby lowering a critical current density (Jc). The second magnetization reversal auxiliary layer 162 may be material selected from the materials that were mentioned when describing the first magnetization reversal auxiliary layer 161. In one example, the first magnetization reversal auxiliary layer 161 and the second magnetization reversal auxiliary layer 162 may be a same material. A second electrode 150 may be provided onto the second magnetization reversal auxiliary layer 162.

A second exchange coupling control layer 172 may be provided between the horizontal free layer 140 and the second magnetization reversal auxiliary layer 162. The second exchange coupling control layer 172 may include magnetic material having a great exchange coupling constant or nonmagnetic material that can increase a surface magnetic anisotropy. The second exchange coupling control layer 172 may strengthen an exchange coupling between the horizontal free layer 140 and the second magnetization reversal auxiliary layer 162. The second exchange coupling control layer 172 may increase a vertical magnetic anisotropy of surfaces of magnetic layers adjacent to the second exchange coupling control layer 172. A second electrode 150 may be provided onto the second magnetization reversal auxiliary layer 162.

The magnetic memory devices in accordance with the first through fourth embodiments of the inventive concept can be realized in various types of semiconductor packages. For example, the magnetic memory devices can be packaged in various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP) and mounted. A package on which a semiconductor memory device in accordance with embodiments of the inventive concept is mounted may further include a controller and/or a logic device controlling the semiconductor memory device.

Figure 6:
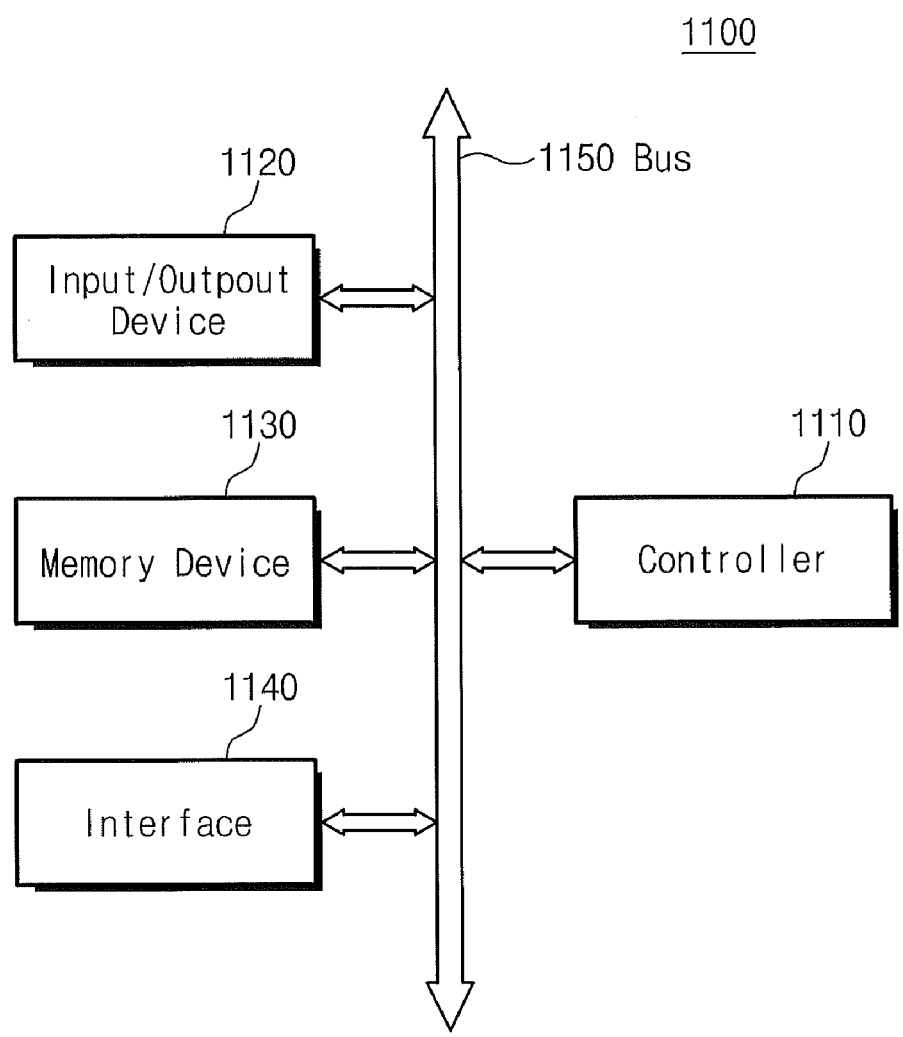
FIG. 6 is a block diagram of an electronic system including a magnetic memory device in accordance with embodiments of the inventive concept.

FIG. 6 is a block diagram of an electronic system including a magnetic memory device in accordance with embodiments of the inventive concept.

Referring to FIG. 6, an electronic system 1100 in accordance with embodiments of the inventive concept may include a controller 1110, an input/output device 1120, a memory device 1130, an interface 1140 and a bus 1150. The controller 1110, the input/output device 1120, the memory device 1130 and/or the interface 1140 may communicate with one another through the bus 1150. The bus 1150 corresponds to a path through which data is transferred.

The controller 1110 may include at least one of a micro processor, a digital signal processor, a microcontroller and a logic device that can perform a function similar to the micro processor, the digital signal processor and the microcontroller. The input/output device 1120 may include at least one selected from a keypad, a keyboard and a display device. The memory device 1130 may store data and/or commands. The memory device 1130 may include at least one of the semiconductor memory devices disclosed in the first through fourth embodiments described herein. Also, the memory device 1130 may further include different types of semiconductor memory devices (e.g., a flash memory device, a DRAM device and/or a SRAM device). The interface 1140 may perform a function of transmitting data to a communication network or receiving data from a communication network. The interface 1140 may be a wireline type or a wireless type. The interface 1140 may include an antenna or a wireline/wireless transceiver. Although not illustrated in the drawing, the electronic system 1100 may further include a high speed DRAM and/or a high speed SRAM as an operating memory for improving an operation of the controller 1110.

The electronic system 1100 may be applied in a personal digital assistant (PDA), a portable computer, a web tablet, a wireless phone, a mobile phone, a digital music player, a memory card or all devices that can transmit and/or receive data in a wireless environment.

Figure 7:
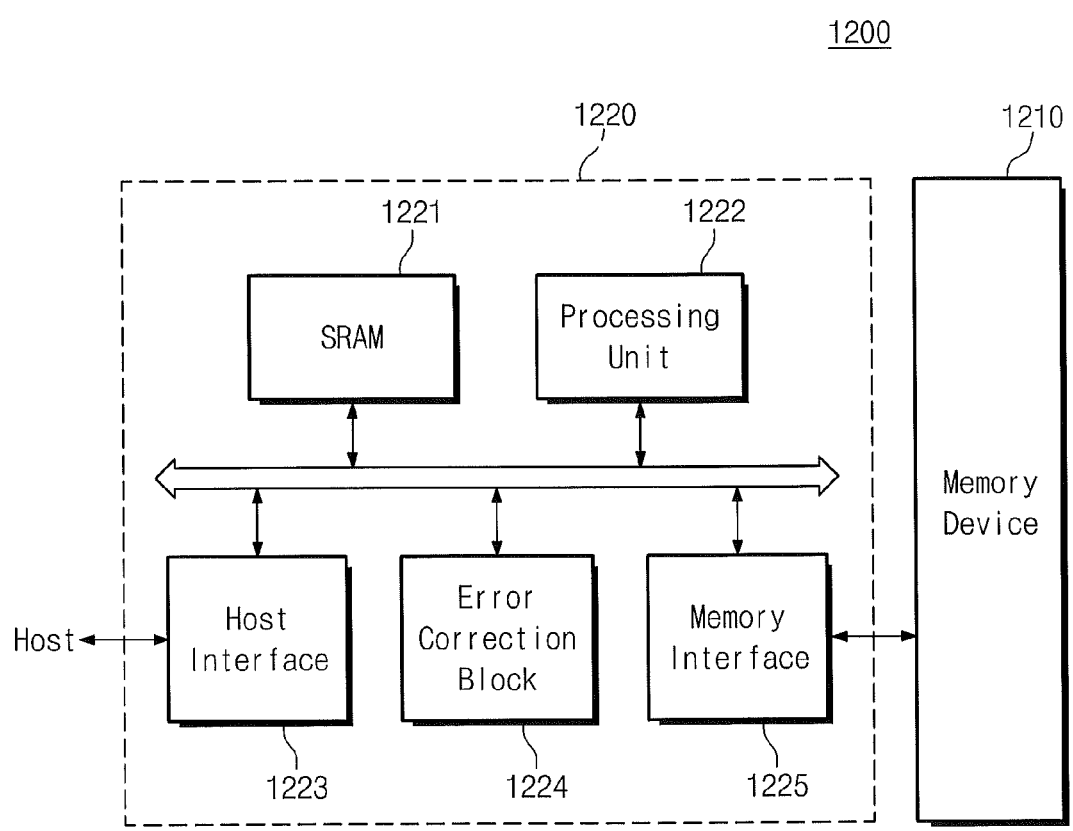
FIG. 7 is a block diagram of a memory card including a magnetic memory device in accordance with embodiments of the inventive concept.

FIG. 7 is a block diagram of a memory card including a magnetic memory device in accordance with embodiments of the inventive concept.

Referring to FIG. 7, a memory card 1200 in accordance with embodiments of the inventive concept includes a memory device 1210. The memory device 1210 may include at least one of the memory devices described in the first through fourth embodiments. Also, the memory device 1210 may further include different types of semiconductor memory devices (e.g., a flash memory device, a DRAM device and/or a SRAM device). The memory card 1200 may include a memory controller 1220 controlling a data exchange between a host and the memory device 1210.

The memory controller 1220 may include a processing unit 1222 controlling an overall operation of the memory card 1200. The memory controller 1220 may include a SRAM 1221 used as an operating memory of the processing unit 1222. In addition, the memory controller 1220 may further include a host interface 1223, an error correction block 1224 and a memory interface 1225. The host interface 1223 may include data exchange protocols between the memory controller 1220 and the host. The memory interface 1225 may connect the memory controller 1220 and the memory device 1210. The error correction block 1224 can detect and correct data readout from the memory device 1210. Although not illustrated in the drawing, the memory card 1200 may further include a ROM device storing code data for interfacing with the host. The memory card 1200 may be used as a portable data storage card. Alternatively, the memory card 1200 may be realized by a solid state disk (SSD) that can replace a hard disk of a computer system.

According to embodiments of the inventive concept, a critical current density can be lowered while maintaining a thermal stability of a magnetic memory device. The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A nonvolatile memory device, comprising:
   a reference magnetic layer having a fixed magnetization direction;
   a tunnel barrier layer on the reference magnetic layer;
   a free layer on the tunnel barrier layer opposite the reference magnetic layer, the free layer having a variable magnetization direction; and
   a magnetization reversal auxiliary layer directly on the free layer, the auxiliary layer having a fixed magnetization direction that is substantially perpendicular to a plane along an interface between the tunnel barrier layer and the reference layer.

2. The device of claim 1, wherein the magnetization reversal auxiliary layer reduces a critical current density required to rotate the variable magnetization direction of the free layer.

3. The device of claim 1, wherein a total magnetic moment of the magnetization reversal auxiliary layer is less than or equal to a total magnetic moment of the free layer.

4. The device of claim 1, wherein the magnetization direction of the auxiliary layer is substantially fixed independent of a voltage, current, and/or magnetic field applied thereto.

5. The device of claim 4, wherein the magnetization direction of the auxiliary layer remains substantially fixed responsive to an external magnetic field of about 1000 gauss applied thereto and/or responsive to a voltage of about 1.2 to about 1.8V applied thereto.

6. The device of claim 1, wherein the fixed magnetization direction of the reference magnetic layer is substantially parallel to the plane along the interface between the tunnel barrier layer and the reference layer.

7. The device of claim 1, wherein the magnetization reversal auxiliary layer comprises a material having a face centered cubic lattice structure and a crystalline growth face in a {111} plane, and wherein the magnetization reversal auxiliary layer has a thickness of about 10 Angstroms (Å) to about 50 Å.

8. The device of claim 7, wherein the magnetization reversal auxiliary layer comprises alternating first and second layers, wherein the first layers comprise cobalt (Co), cobalt iron (CoFe), and/or cobalt chromium (CoCr), and wherein the second layers comprise palladium (Pd), platinum (Pt), nickel (Ni) and/or ruthenium (Ru).

9. The device of claim 1, wherein the magnetization reversal auxiliary layer comprises an amorphous layer of cobalt iron terbium (CoFeTb), cobalt iron dysprosium (CoFeDy), and/or cobalt iron gadolinium (CoFeGd), and wherein the magnetization reversal auxiliary layer has a thickness of about 5 Angstroms (Å) to about 60 Å.

10. The device of claim 1, wherein the magnetization reversal auxiliary layer comprises a $L1_0$ structure including iron platinum (FePt), iron palladium (FePd), iron nickel (FeNi), cobalt platinum (CoPt), cobalt palladium (CoPd), or cobalt nickel (CoNi), and wherein the magnetization reversal auxiliary layer has a thickness of about 5 Angstroms (Å) to about 30 Å.

11. The device of claim 1, wherein the magnetization reversal auxiliary layer comprises a hexagonal close packed structure including cobalt platinum (CoPt), cobalt palladium (CoPd), cobalt manganese (CoMn), cobalt chromium platinum (CoCrPt), cobalt chromium palladium (CoCrPd), or cobalt chromium manganese (CoCrMn), and wherein the magnetization reversal auxiliary layer has a thickness of about 5 Angstroms (Å) to about 30 Å.

12. The device of claim 1, further comprising:
   a seed layer on the magnetization reversal auxiliary layer opposite the free layer, wherein the seed layer comprises a material from which the magnetization reversal auxiliary layer is formed.

13. The device of claim 1, wherein the magnetization reversal auxiliary layer comprises a second magnetization reversal auxiliary layer, and further comprising:
   a first magnetization reversal auxiliary layer directly on the free layer opposite the second magnetization reversal auxiliary layer and extending between the free layer and the tunnel barrier layer, the first magnetization reversal auxiliary layer having a fixed magnetization direction that is substantially perpendicular to the plane along the interface between the tunnel barrier layer and the reference layer.

14. A nonvolatile memory device, comprising:
   a reference magnetic layer;
   a tunnel barrier layer on the reference magnetic layer;
   a free layer on the tunnel barrier layer opposite the reference magnetic layer, the free layer having a variable magnetization direction;
   an exchange coupling control layer on the free layer opposite the tunnel barrier layer; and
   a magnetization reversal auxiliary layer on the exchange coupling control layer, the auxiliary layer having a fixed magnetization direction that is substantially perpendicular to a plane along an interface between the tunnel barrier layer and the reference layer,
   wherein the exchange coupling control layer comprises a material configured to strengthen an exchange coupling between the free layer and the auxiliary layer.

15. The device of claim 14, wherein the exchange coupling control layer comprises transition metal.

16. The device of claim 14, wherein the exchange coupling control layer comprises at least one of titanium (Ti), chromium (Cr), ruthenium (Ru), copper (Cu), manganese (Mn), vanadium (V), osmium (Os), platinum (Pt), palladium (Pd), rhodium (Rh), rhenium (Re), or gold (Au).

17. The device of claim 14, further comprising:
   an oxide layer between the exchange coupling control layer and the magnetization reversal auxiliary layer thereon.

18. The device of claim 14, wherein the exchange coupling control layer comprises a second exchange coupling control layer and a first exchange coupling control layer on the free layer opposite the second exchange coupling control layer, wherein the magnetization reversal auxiliary layer comprises a second magnetization reversal auxiliary layer and a first magnetization reversal auxiliary layer on the first exchange coupling control layer opposite the free layer, wherein the first magnetization reversal auxiliary layer and the first exchange coupling control layer extend between the tunnel barrier layer and the free layer.

19. The device of claim 18, wherein the first and second exchange coupling control layers are directly on the free layer on opposite sides thereof, and wherein the first and second magnetization reversal auxiliary layers are directly on the first and second exchange coupling control layers, respectively, on opposite sides of the free layer.

20. A nonvolatile memory device, comprising:
a reference magnetic layer comprising an antiferromagnetic pinning layer and a ferromagnetic pinned layer having a fixed magnetization direction in a plane along an interface therebetween;
a tunnel barrier layer comprising an oxide layer on the reference magnetic layer;
a first magnetization reversal auxiliary layer on the tunnel barrier layer opposite the reference magnetic layer, the first magnetization reversal auxiliary layer having a fixed magnetization direction that is substantially perpendicular to the plane defined by the interface between the pinned and pinning layers;
a first exchange coupling control layer on the first magnetization reversal auxiliary layer opposite the tunnel barrier layer;
a free layer on the first exchange coupling control layer, the free layer comprising a ferromagnetic layer having a variable magnetization direction;
a second exchange coupling control layer on the free layer opposite the first exchange coupling control layer, the first and second exchange coupling control layers respectively comprising materials configured to strengthen an exchange coupling between the free layer and the first and second exchange coupling control layers on opposite sides thereof; and
a second magnetization reversal auxiliary layer on the second exchange coupling layer, the second magnetization reversal auxiliary layer having a fixed magnetization direction that is substantially perpendicular to the plane defined by the interface between the pinned and pinning layers.

* * * * *